(12) United States Patent
Sillmon et al.

(10) Patent No.: US 6,676,758 B2
(45) Date of Patent: *Jan. 13, 2004

(54) GAS COLLECTOR FOR EPITAXIAL REACTOR

(75) Inventors: Roger Sillmon, Troutville, VA (US); Khang V. Nguyen, Salem, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 369 days.

This patent is subject to a terminal disclaimer.

(21) Appl. No.: 09/884,944

(22) Filed: Jun. 21, 2001

(65) Prior Publication Data

US 2002/0017244 A1 Feb. 14, 2002

Related U.S. Application Data

(63) Continuation-in-part of application No. 09/635,268, filed on Aug. 9, 2000.

(51) Int. Cl.[7] ............................................. C23C 16/00
(52) U.S. Cl. .................. 118/715; 118/733; 156/345.29
(58) Field of Search ............................ 118/715, 733; 156/345.29

(56) References Cited

U.S. PATENT DOCUMENTS

| | | | |
|---|---|---|---|
| 4,961,399 A | 10/1990 | Frijlink | 118/730 |
| 4,976,217 A | 12/1990 | Frijlink | 118/733 |
| 5,441,568 A * | 8/1995 | Cho et al. | 118/715 |
| 5,558,717 A * | 9/1996 | Zhao et al. | 118/715 |
| 5,582,866 A | 12/1996 | White | 427/248.1 |
| 5,846,330 A | 12/1998 | Quirk et al. | 118/723 DC |
| 5,885,356 A * | 3/1999 | Zhao et al. | 118/723 ER |
| 5,895,530 A * | 4/1999 | Shrotriya et al. | 118/715 |
| 6,325,855 B1 * | 12/2001 | Sillmon et al. | 118/715 |
| 6,423,949 B1 * | 7/2002 | Chen et al. | 219/444.1 |
| 6,478,877 B1 * | 11/2002 | Sillmon et al. | 118/733 |
| 6,530,992 B1 * | 3/2003 | Yang et al. | 118/695 |
| 6,582,522 B2 * | 6/2003 | Luo et al. | 118/715 |
| 2002/0017244 A1 * | 2/2002 | Sillmon et al. | 118/715 |

FOREIGN PATENT DOCUMENTS

| | | |
|---|---|---|
| GB | 1 215 140 A | 12/1970 |
| WO | WO 00/04205 | 1/2000 |

OTHER PUBLICATIONS

"Layer uniformity in a multiwafer MOVPE reactor for III–V compounds" P.M. Frijlink et al., *Journal of Crystal Growth*, North–Holland Publishing Co., Amsterdam, NL, vol. 107, No. 1 / 4, 1991, pp. 166–174, XP000246591, ISSN: 0022–0248.

* cited by examiner

Primary Examiner—Jeffrie R. Lund
(74) Attorney, Agent, or Firm—McDermott, Will & Emery

(57) ABSTRACT

A gas collector for collecting gasses from within a reaction chamber of a reactor comprises a rigid body having a conduit, inlets, an outlet, and a seal disposed on the body. The seal cooperates with a lid of the reactor to prevent escape of reaction gasses from the reaction chamber. The inlets direct the gasses from the reaction chamber into the conduit, and the outlet exhausts the gasses from the conduit. The body includes a first member and a second member with the seal disposed on the second member. The body can include inter-member seals for reducing the flow of the gasses across an interface between the first member and the second member. The inter-member seals disposed between the first member and the second member and allow movement of the first member relative to the second member. The body can also be formed from graphite and can also shape the flow of gasses into the reaction chamber to prevent the formation of standing eddy currents adjacent the gas collector. A method of manufacturing a semiconductor device with the gas collector is also disclosed.

114 Claims, 5 Drawing Sheets

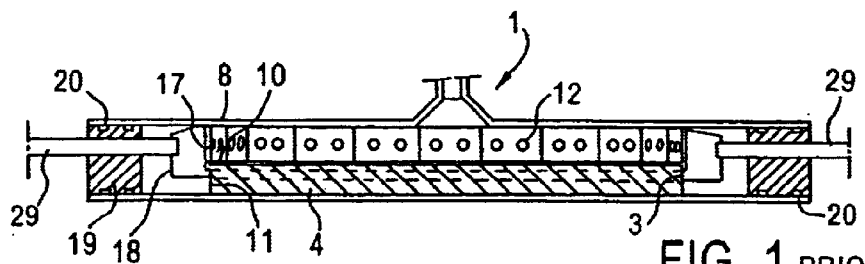
FIG. 1 PRIOR ART
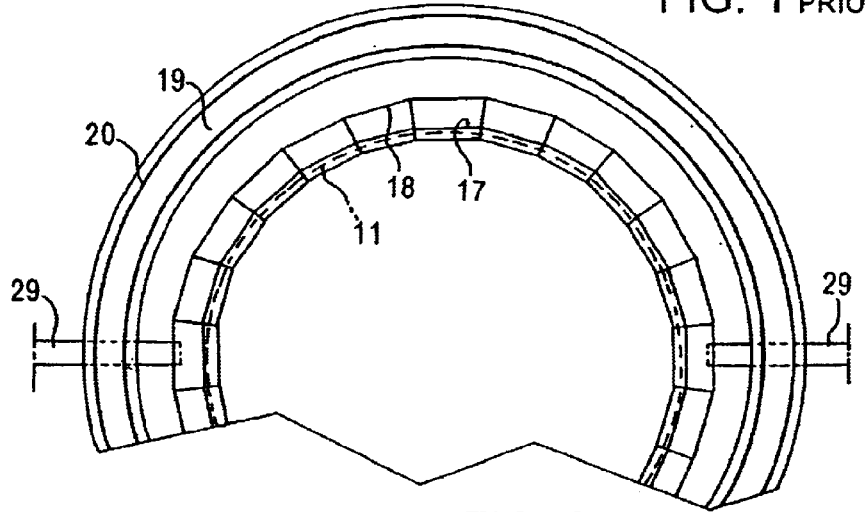
FIG. 2 PRIOR ART
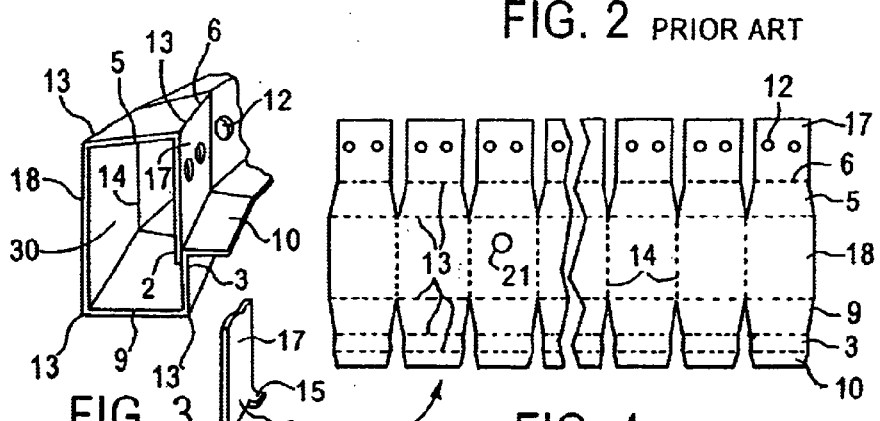
FIG. 3 PRIOR ART
FIG. 4 PRIOR ART
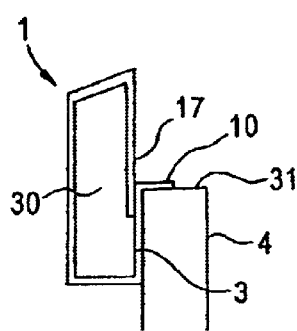
FIG. 5 PRIOR ART

GAS COLLECTOR FOR EPITAXIAL REACTOR

CROSS REFERENCE TO RELATED APPLICATIONS

This application is a continuation-in-part of U.S. application Ser. No. 09/635,268 filed Aug. 9, 2000, now pending, incorporated herein by reference.

FIELD OF THE INVENTION

The present invention relates to epitaxial reactors and, more particularly, to a gas collector for epitaxial reactors.

BACKGROUND OF THE INVENTION

Continuing advances in the semiconductor industry have resulted the development of highly complex thin-film deposition processes for fabricating semiconductor devices that are packaged for use in the manufacture of sophisticated electronic devices. The thin films of material that are deposited on semiconductor wafers are often referred to as epitaxial layers. High speed electronic transistors, quantum-well diode lasers, light-emitting diodes, photodetectors, and optical modulators incorporate structures composed of numerous epitaxial layers ranging in thickness from several microns to as thin as a few tenths of a nanometer. These epitaxial layers are typically deposited, or grown, on a single-crystal substrate, i.e., the semiconductor wafer.

One method of forming epitaxial layers on a semiconductor wafer is known as chemical vapor deposition (CVD). In a typical manufacturing process of a wafer, for example, silicon or gallium arsenide in extremely pure crystalline form is overlaid sequentially with numerous layers of materials which function as conductors, semiconductors, or insulators. Each subsequent layer is ordered and patterned such that the sequence of layers forms a complex array of electronic circuitry. The semiconductor wafer can then be subsequently cut along predetermined scribe lines into individual devices, commonly referred to as "chips." These chips ultimately function as key components in electronic devices ranging from simple toys to complex supercomputers.

CVD processes normally take place within a reaction chamber. Initially, the semiconductor wafer is placed within a reaction chamber containing an inert atmosphere, and the temperature within the reaction chamber is elevated. Reaction gasses containing the compound or element to be deposited are then introduced to react with the surface of the semiconductor wafer, which results in deposition of the required film onto the semiconductor wafer. The reacted gasses are continually introduced and removed from the reaction chamber until a requisite film thickness has been achieved.

An example of an epitaxial reactor is described in U.S. Pat. No. 4,961,399, to Frijlink, which is incorporated herein by reference. This patent describes a reactor into which reaction gasses are introduced via a quartz funnel that is located at the center of the reactor. The reaction gasses then flow radially outward towards a quartz ring that bounds the reactor. Along the circumference of the quartz ring are equidistant slits, which collect the reacted gasses and increase the uniformity of the distribution of the reaction gasses within the reaction chamber. Bounding the upper portion of the reaction chamber is a quartz disk. The quartz disk seals against O-rings, witch are positioned behind the quartz ring. Because quartz is a brittle and inflexible material, the quartz disk does not seal against the quartz ring. Instead, a gap is provided between the quartz disk and the quartz ring to prevent chipping of either.

This gap between the quartz disk and the quartz ring can cause problems within the reactor. For example, reaction gasses can escape through the gap and can form deposits outside the reaction chamber. These deposits can interfere with the working of the reaction chamber and can also flake off and act as contaminants. Although a narrower gap can be provided, if a hard foreign body wider than the gap is introduced into the gap, such as during the opening of the reaction chamber, the foreign body could prevent the quartz disk from sealing properly over the reaction chamber or can cause chipping of either the quartz disk or the quartz ring.

An attempted solution to the above-mentioned problems is described in U.S. Pat. No. 4,976,217 to Frijlink, which is incorporated herein by reference. This patent describes a collecting crown or gas collector, which is both used to collect reaction gasses from the reaction chamber and also to provide a seal between the reaction chamber and a quartz disk or cover.

The gas collector and reaction chamber of the prior art is illustrated in FIGS. 1 and 2. The gas collector 1 is mounted on a supporting platform 4 by a horizontal plate 10 that rests upon the supporting platform 4. The supporting platform 4 is typically formed from quartz and is positioned within a cylindrical body 19 of the reactor that surrounds the reaction chamber and the gas collector 1. The cover 8 of the reaction chamber bounds the top of the reaction chamber and seals against the upper ridge 6 of the gas collector 1 and against toric joints 20 within the cylindrical body 19.

The gas collector 1 is further illustrated in FIG. 3. The gas collector 1 is formed from a folded plate of molybdenum having elastic properties. The molybdenum plate is folded along horizontal folding lines 13 and vertical folding lines 14 to form multiple flat plates 17, 5, 18, 9, 3, 10 that are connected to one another along the folding lines 13, 14. Also, two plates 2, 3 are touching without being fixed to each other. The combination of plates 17, 5, 18, 9, 3, 10 form a conduit 30 that encircles the reaction chamber. One of the plates 17 includes regularly spaced inlets holes 12 that collect the reaction gasses from the reaction chamber. Instead of the inlet hole 12, as shown below on the right-hand side of FIG. 3, the wall plate 17 can be provided with folded lower projections 15, which separate the movable lower edge 2 away from the fixed edge 3 to leave a slot between the edges 2, 3 through which the reaction gas can then pass.

The '217 patent states that an essential element of the gas collector 1 is the vertical baffle plate, which is constituted by plates 17, 3 with the lower edge 2 of the upper plate 17 being pressed with a sliding motion against the upper edge of the lower plate 3. The horizontal plates 10 that are connected to the lower plates 3 serve to place the gas collector 1 on the edge of the platform 4 (best shown in FIG. 5). Furthermore, the top plate 5 is inclined and includes an upper ridge 6.

Due to the vertical folding lines 14, the conduit 30 is divided into successive parts. The whole of the gas collector 1 constitutes a polygon surrounding the platform (the partly shown polygon in FIG. 2 is a polygon having 24 sides). When the cover 8 is not yet positioned over the gas collector 1, the upper ridge 6 of the gas collector 1 is slightly higher than the upper surface of the cylindrical body 19 of the reactor. Thus, when the cover 8 is positioned on the gas collector 1, the cover 8 presses against the ridge 6 of the top plate 5. The downward force by the cover 8 also causes firm contact of the horizontal plate 10 with the top surface 31 of the platform 4. Because the horizontal plate 10 is fixed on the fixed platform 4, plates 3, 9, 18, 5 constitute a spring which allows the ridge 6 and upper plate 17 to be moved with respect to the fixed platform 4. The springing action of the plates 3, 9, 18, 5 causes the upper plate 17 to rise with respect to the lower plate 3 after the force against the top plate 5 by the cover 8 is removed.

As illustrated in FIG. 4, the gas collector 1 can be formed from a molybdenum plate made of a single cut piece. The folding lines 13, 14 are marked, for example, with a dotted line of holes made by of a laser. Consequently, during the manufacturing of the gas collector 1, the plate is folded along the folding lines 13, 14 provided. An exhaust 21 can also be provided and is connected to a tube 29 (best shown in FIG. 2) that exhausts the reaction gasses from the conduit formed by the gas collector 1.

The '217 patent states that reaction gasses introduced into the reaction chamber cannot pass between the ridge 6 of the gas collector 1 and the cover 8, and reaction gasses cannot pass either between the horizontal plate 10 and the platform 4; and therefore, the reaction gasses pass exclusively through the inlets 12 and do not form dirtying deposits on either the cover 8 or on the periphery 11 of the platform 4. However, actual use of this gas collector 1 has proved otherwise.

The disclosed gas collector 1 suffers several problems. A non-exhaustive list of these problems include contamination of the periphery 11 of the platform, the top plate 5, and the cylindrical body 19; uneven gas flow and gas density of the reaction gasses through the reaction chamber; and contamination within the reaction chamber. Many of these problems stem from the gas collector 1 being formed a sheet of molybdenum, which is folded along folding lines 13, 14. Sheet metal structures are very difficult to manufacture to a high degree of dimensional precision. For example, the bending of the sheet metal along the folding lines 13, 14 is imprecise at best. Furthermore, the gas collector 1 is constructed using small screws and nuts, which do not lend themselves to maintaining a high degree of dimensional precision.

The gas collector 1 being formed by sheet metal, therefore, provides poor dimensional precision or tolerances for both the horizontal plate 10 extending over the platform 4; the positions of the inlets 12 in the upper plate 17; the connections of the upper plates 17 with one another; and the ridges 6 of the top plate 5. Another reason for the poor dimensional tolerances of the gas collector 1 results from thermal stressing of the sheet metal during the deposition process. As the thin molybdenum sheet metal of the gas collector 1 expands and contracts during each process cycle, the gas collector 1 eventually buckles and warps, thereby destroying the dimensional integrity of the gas collector 1.

The result of these poor dimensional tolerances is that gas collector 1, although purporting to seal the reaction gasses within the reaction chamber except through the inlets holes 12, provides numerous locations for the reaction gasses to escape the reaction chamber. For example, the ridge 6 often fails to complete seal the gas collector 1 against the cover 8. As such, reaction gasses are free to flow past the ridge 6 and form deposits, for example, on the top plate 5, rear plate 18, and on the cylindrical body 19.

The deposits formed on the gas collector 1 and cylindrical body 19 require frequent cleaning of both the gas collector 1 and the cylindrical body 19. For example, in one application, the disclosed gas collector 1 was being cleaned after approximately every 20 process cycles. Furthermore, because the gas collector 1 is formed by molybdenum sheet metal, the deposits on the gas collector 1 are very difficult to remove without damaging the gas collector 1. This limits the number of cleanings of a particular gas collector 1, on average, to three times before the gas collector 1 is replaced.

A disadvantage of having deposits on the gas collector 1 is that the deposits can flake off and contaminate the inside of the reactor. These flakes can interfere with the deposition process on the semiconductor wafers and can cause the subsequent rejection of the wafers. With the disclosed gas collector 1 of the prior art, for example in one application, approximately 13.5% of the wafers are rejected for contamination caused by flakes.

The flakes are caused, for example, because the gas collector 1 is formed from molybdenum sheet metal. Molybdenum is a material onto which deposits cannot firmly adhere. As such, these deposits can easily flake off when stressed. Flexing of the molybdenum sheet metal creates the stresses within the deposits that cause the formation of the flakes or chips. The sheet metal flexes for several reasons, one of which is that the gas collector is formed from sheet metal, and sheet metal is notorious for flexing, which also relates to why constructs made from sheet metal have poor positional tolerances. A second reason is that the gas collector 1 is designed to be flexed. As stated above, the plates 3, 9, 18, 5 constitute a spring; and therefore, any deposits formed on the plates 3, 9, 18, 5 are subject to stress during the opening and closing of the cover 8. Still another reason for flexing is that molybdenum expands and contracts because of the heating and cooling of the gas collector 1 during a process cycle.

Another source of flakes is that the horizontal plate 10 extends radially inward towards the reaction chamber from the gas collector 1. As illustrated in FIG. 5, in the gas collector 1 of the prior art, the horizontal plate 10 extends inward to about half the width of the top surface 31 of the platform 4 and leaves the other half of the top surface 31 exposed. During processing, deposits build up on both the horizontal plate 10 and the exposed half of the top surface 31. It has been noticed that movement of the horizontal plate 10, for example, when the reactor cover 8 is closed to compress the gas collector 1, causes the horizontal plate 10 to move relative to the platform 4. This movement of the horizontal plate 10 on the platform 4 stresses deposits that bridge the top surface 31 of the platform 4 and the horizontal plate 10 and disadvantageously cause the formation of flakes.

The reactor disclosed above in U.S. Pat. No. 4,961,299, with which the gas collector 1 of the prior art is used, is designed such that reaction gasses flow evenly from the center of the reaction chamber outward into the gas collector 1. A flow is considered even if the gas densities and velocities at a given radius away from the center of the reaction chamber are substantially equal. If the reaction gasses are not flowing evenly from the center of the reaction chamber, the deposition process varies depending upon the location of the wafers within the reaction chamber because the densities of the various constituents of the reaction gasses also vary. As such, the thickness and quality of the deposition can vary from one wafer to the next, even within the same batch process. For example, when depositing $Al_xGaAs$ using the gas collector 1 of the prior art, the percentage (x) of aluminum being deposited varies not only from one batch of wafers to the next, but also varies within wafers in single batch and also within a single wafer.

Obtaining an even flow of reaction gasses, however, is difficult with the gas collector 1 of the prior art. An even flow of reaction gasses results from the gas collector 1 providing an identical pressure differential between the reaction chamber and the conduit 18 inside the gas collector 1. As stated above, however, the gas collector 1 of the prior art is constructed with poor positional tolerances which provide gaps between the ridge 6 and the cover 8; gaps between adjacent front plates 17; and gaps between the horizontal plate 10 and the platform 4. Additionally, the holes used to form the bending lines 13, 14 also provide additional gaps in the gas collector 1. These gaps are not consistent along the circumference of the gas collector 10 and create different pressure differentials along the circumference, which therefore causes the reaction gasses to have different flow patterns depending upon the radial direction the reaction gasses flow.

Furthermore, the inlet holes 12 are positioned on a front plate 17 that is movable relative to the platform 4. This movement of the inlet holes 12 relative to the reaction chamber can change each time the cover 8 is raised and lowered and causes different flow rates that can vary during each batch process and/or from each gas collector 1. For example, the amount of pressure placed on the gas collector 1 when the cover 8 of the reactor is closed can vary, and this can cause the positions of the inlet holes 12 to vary. Also, for example, the positions of the inlet holes 12 can vary even if the pressure of the cover 8 remains the same because the flexibility of sheet metal forming the gas collector 1 varies over time. Furthermore, because the gas collector 1 of the prior art is made from sheet metal and is constructed used small screws, the flexibility or springiness of a particular gas collector 1 cannot be formed consistently, and therefore, the springiness varies from one gas collector 1 to the next. These positional variations of the inlet holes 12 cause the flow pattern of reaction gasses through the reaction chamber to change, and this change of the gas flow pattern affects the deposition process. Thus, the positioning of inlets 12 in a member movable relative to the reaction chamber causes an undesirable variance in the deposition process.

Another problem resulting from use of the gas collector 1 of the prior art is the creation of standing eddy currents adjacent the gas collector 1 that trap reaction gasses during processing. This can be a problem, for example, when a processing sequence using the reaction chamber changes reaction gas mixtures during the process. During the process of changing reaction gasses, the old reaction gasses are purged from the reaction chamber and the new reaction gasses are then introduced into the reaction chamber. However, because the old reaction gasses can be trapped in the standing eddy currents, these old reaction gasses can be subsequently reintroduced into the reaction chamber during the processing with the new reaction gasses, and this contamination of the new reaction gasses can have adverse effects on the process. The standing eddy currents are formed in sharp corners of the gas collector 1, such as illustrated in FIG. 5, where, for example, vertical plate 17 meets horizontal plate 10.

An example of this problem occurs during the doping of a GaAs semiconductor. Silicon is used for N-type doping of GaAs and zinc is used for P-type doping of GaAs. If the gasses that provide these dopants are not completely removed before the other gas is introduced, the active regions created by the doping can become washed out, which degrades the performance of the device being manufactured.

There is therefore a need for a gas collector that prevents the problems of the prior art, which include leakage of reaction gasses past the gas collector; flakes formed during the flexing of the gas collector; and uneven flow caused by the various gaps introduced into the gas collector.

SUMMARY OF THE INVENTION

This and other needs are met by embodiments of the present invention which provide a gas collector for collecting gasses from within a reaction chamber of a reactor. The gas collector includes a rigid body, in which is defined a conduit, inlets, an outlet, and a seal. The seal cooperates with a removable lid of the reactor to prevent escape of the gasses from the reaction chamber. Also, the inlets direct the gasses from the reaction chamber into the conduit, and the outlet exhausts the gasses from the conduit into an exhaust pipe of the reactor.

By using a rigid body, the body resists flexing, which creates stress on deposits formed on the body. The stressing of the deposits creates chips or flakes of the deposited material, which can cause the rejection of a device being coated within the reactor. The reduction of flexing by using a rigid body advantageously reduces incidences of chips and flakes.

In another embodiment of the present invention, a gas collector includes a body, in which is defined a conduit, inlets, an outlet, and a seal. The body also includes at least two members separate from one another. The body can also include inter-member seals that reduce the flow of the gasses across an interface between a first member and a second member of the body. The inter-member seals are disposed between the first member and the second member and allow movement of the first member relative to the second member. One of the inter-member seals can be formed on an outer wall, which is opposite an inner wall adjacent the reaction chamber. Also, each of the inter-member seals can allow movement of the first member relative to the second member in a common direction.

In one aspect of the gas collector, one of the first and second members defines a groove, and an other of the first and second members includes a projection with the projection engaging the groove to form the inter-member seal. Alternatively, the inter-member seal includes a male portion and a female portion interengaging with one another. Furthermore, the male portion is at least partially inserted into the female portion when the gas collector and the lid are separated, and the male portion extends about 40% to about 60% of the depth of the female portion when the gas collector is engaged with the lid.

By providing at least two member separate from one another, the conduit of the gas collector can be more easily cleaned by separating the two member before cleaning. In contrast, access to the conduit of the gas collector of the prior art is very difficult because the gas collector is formed by a single piece of sheet metal.

In yet another embodiment of the present invention, a gas collector includes a body, in which is defined a conduit, inlets, an outlet, and a seal. Also, the inlets are stationary relative to the reaction chamber. Furthermore, the body can include a first member stationary relative to the reaction chamber and a second member movable relative to the reaction chamber with the inlets disposed in the first member. By positioning the inlets on a member that is stationary relative to the reaction chamber, the flow pattern of the gasses through the reaction advantageously becomes more consistent.

Additionally, the gas collector can include a device for pressing the seal against the lid, and the device can contact both the first member and the second member to press the seal located on the second member against the lid. Still further, the device can include resilient members, which are disposed within the conduit. Also, the device can permit passage of the gasses through the device with an example being springs with open coils. The springs can be positioned in the conduit with seats that are formed in at least one of the members of the body.

In still another embodiment of the present invention, a gas collector includes a body in which is defined a conduit, inlets, an outlet, at least one lip, and a seal. The lip is disposed on a portion of the body adjacent the reaction chamber, and the lip evenly shapes the flow of the gasses into the inlets. Additionally, the lip can be positioned on a portion of the body stationary relative to the reaction chamber. In one aspect, the lip slopes horizontally inwards towards the reaction chamber and slopes vertically away from the inlets. Additionally, the lip can have a curved and/or straight profile.

By providing a lip the shape the flow of the gasses into the inlets, the gasses flow smoother through the reactor. This provides for a more consistent deposition within the reactor. Also, unlike the gas collector of the prior art that includes features that create standing eddy currents, which trap reaction gasses, adjacent the gas collector the lip can be formed to reduce the trapping of reaction gasses. Importantly, trapped reaction gasses could otherwise be reintroduced into the reaction chamber to the detriment of the process, particularly when the process uses multiple gas compositions during the process.

In a further embodiment of the present invention, a gas collector includes a body, in which is defined a conduit, inlets, an outlet, at least one lip, and a seal. The lip supports the body on a platform in the reaction chamber, and the lip completely covers a top surface of the platform. In the gas collector of the prior art, only a portion of the top surface of the platform was covered, and this caused the formation of chips and flakes. However, by completely covering the top surface, the formation of chips and flakes have been reduced.

In still a further embodiment of the present invention, a method for forming deposits on a semiconductor device within a reaction chamber of an epitaxial reactor is disclosed. The method includes introducing reaction gasses into a central portion of the reaction chamber; drawing the gasses radially outward from the central portion into a conduit in a gas collector of the reactor; evenly shaping the flow of the gasses into inlets formed in the gas collector; and forming the deposits on the semiconductor device as the gas flow from the central portion of the reaction chamber into the gas collector. The method can include directing the gasses from the conduit to an exhaust pipe through at least one outlet formed in the gas collector. Additionally, the gasses can be completely removed from reaction chamber before introducing reaction gasses with a different composition into the reaction chamber. Also, the material being deposited can include GaAs.

In yet another embodiment of the present invention, a gas collector includes a body, in which is defined a conduit, inlets, an outlet, and a seal. Also, the body includes graphite. Graphite advantageously remains stable at high temperatures and does not outgas any contaminants or particles. Furthermore, reaction materials such as GaAs readily adhere to graphite, and graphite is a rigid material that resists flexing and has a lower coefficient of thermal expansion as compared to many metals. In addition, graphite has good machinability, which allows for a closer control of dimensional tolerances.

Additional advantages of the present invention will become readily apparent to those skilled in this art from the following detailed description, wherein only an exemplary embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout and wherein:

FIG. 1 is a side cross-sectional view of a gas collector and reactor in accordance with the prior art;

FIG. 2 is a plan view of the reactor shown in FIG. 1 with the cover removed;

FIG. 3 is a perspective cross-sectional view of the gas collector in FIG. 1;

FIG. 4 is a plan view of a plate from which the gas collector of the prior art is formed by folding;

FIG. 5 is a partial side cross-sectional view of the gas collector of the prior art resting on a platform within the reactor;

DETAILED DESCRIPTION OF THE INVENTION

The present invention addresses and solves the problem of a reaction chamber creating detrimental contaminants within a reaction chamber and maintaining a even flow of reaction gasses from the reaction chamber into the gas collector. This is achieved, in part, by providing a gas collector having a rigid body that prevents the gas collector from flexing, which creates contaminating flakes from reaction material deposited on the gas collector. The gas collector also reduces the occurrence of standing eddy currents by shaping the gas flow into inlets on the gas collector. Additionally, by maintaining a tight seal between the gas collector and both the reactor and the lid of the reactor, the gas flow through the reaction chamber is more predictable.

Figure 6:
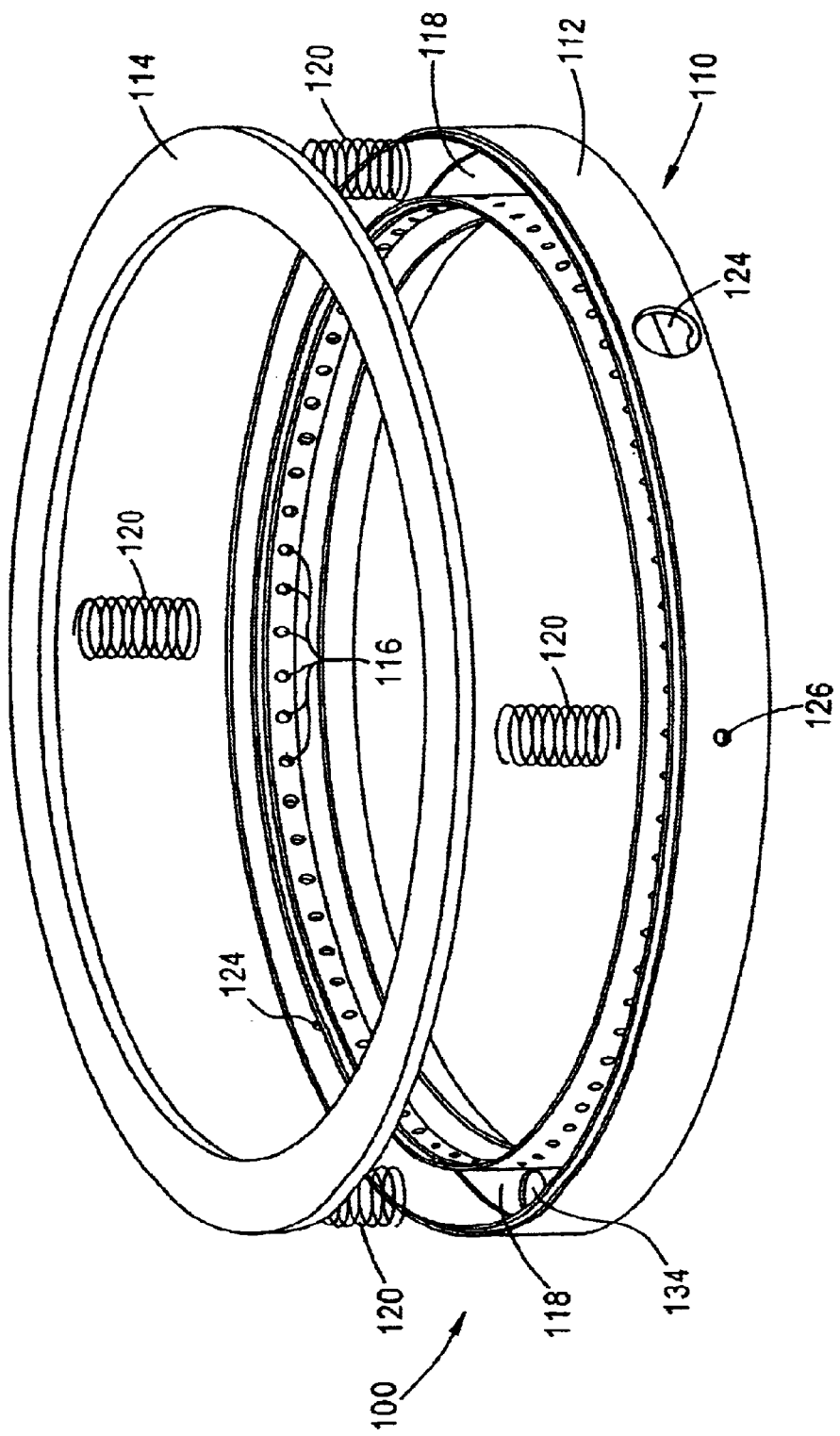
FIG. 6 is an exploded view of a gas collector constructed in accordance with the present invention.

A gas collector according to one aspect of the invention is illustrated in FIG. 6. The gas collector 100 includes a body 110 having inlets 116 for receiving gasses from the reaction chamber (best shown in FIGS. 1 and 2) of the reactor. The gas collector is used with a reactor, although the gas collector is not limited in its use as to a particular reactor. However, in a current aspect of the invention, the gas collector is used with an epitaxial reactor, such as the epitaxial reactors disclosed in U.S. Pat. Nos. 4,961,399 and 4,976,217.

In one aspect of the invention, the body 110 includes at least two members 112, 114 separate from each other. The members 112, 114 of the body 110, either individually or in combination, receive gasses from within the reaction chamber of the reactor and also cooperate with the reactor, for example the lid of the reactor, to form a seal that reduces the escape of gasses from the reaction chamber. The gas collector 100 collects chemical vapors (i.e., reaction gasses from chemical vapor deposition) into a conduit 118 from the reaction chamber of the reactor and directs the reaction gasses to the reactor's exhaust pipes (best shown in FIG. 2 with reference number 29) through outlets 124 formed in a outer wall of the body 110. Although not limited in this manner, the gas collector 100 can include at least one secondary inlet 126 formed in the outer wall of the body 110 to facilitate introduction of a purge gas into the conduit 118. Besides the inlet and outlet holes 116, 126, 124, in one aspect of the invention, the body 110 surrounds the conduit 118 and prevents escape of gasses from within the conduit 118.

The invention is not limited as to a particular seal between the body 110 and the lid. For example, the seal can be a strip of flexible material, such as molybdenum, positioned on a top portion of the body 110. However, in a current aspect of the invention, the seal is the top surface of the body 110.

The portion (or inner wall) of the body 110 adjacent the reaction chamber is not limited as to a particular shape. In a current aspect of the gas collector 100, however, the gas collector 100 surrounds at least a portion of the periphery of the reaction chamber. Furthermore, the gas collector 100 can surround a portion of the circular-shaped periphery of the reaction chamber. In this manner, the gas collector 100 directs gasses within the reaction chamber to flow radially outward into the gas collector 100. For example, if the reaction chamber has a circular cross-section when examined from a top plan view, the portion of the body 110 adjacent the reaction chamber can have a generally circular configuration.

In one aspect of the invention, the second member 114 can cooperate with a lid (best shown in FIG. 1 with reference number 8) of the reactor to reduce the escape of reaction gasses from the reaction chamber. In operation, the lid is lowered onto the second member 114 to form a seal between the second member 114 and the lid. In one aspect of the invention, the second member 114 is movable with respect to the first member 112. Additionally, inter-member seals 122 (shown in FIGS. 7 and 8) can be provided between the first and second members 112, 114. The inter-member seals 122 allow movement of the first and second members 112, 114 relative to one another and reduce the escape of reaction gasses from the conduit 118 through an interface between the first and second members 112, 114, and any inter-member seals 122 so capable are acceptable for use with the invention.

In a current aspect, an inter-member seal 122 includes a female portion 130 and a male portion 132 interengaging with one another. The female portion 130 is positioned on either the first member 112 or the second member 114 and the male portion 132 is positioned on the opposite member, which is respectively the second member 114 or the first member 112. Additionally, in a current aspect of the invention, the gas collector includes a matched pair of inter-member seals 122 respectively disposed on an inner wall and an outer wall of the gas collector 100. The seals 122 are matched because both seals allow movement of the first member 112 relative to the second member 114 in common directions. By providing a matched pair of inter-member seals 122, the second member 114 can move relative to the first member 112 without either the first or second member 112, 114 flexing.

The gas collector of the prior art, in contrast, only provides one seal between two adjacent plates, which requires the body of the gas collector to flex in order to have one of the two adjacent plates move relative to the other plate. This flexing of the body of the gas collector causes stress in any deposition material formed on the body, which leads to the detrimental formation of flakes. However, because a pair of matched inter-member seals 122 are provided according to one aspect of the invention, the first and second member 112, 114 can advantageously remain rigid.

The gas collector 100 receives gasses from within the reaction chamber through inlets 116 in the portion of the body 110 adjacent the reaction chamber. The inlets 116 can be formed in any of the members 110, 112, and the inlets 116 are not limited as to a particular shape or size nor are the inlets 116 limited as to a particular distribution pattern in the members 110, 112. For example, the shape of the inlets 116 can be narrow slits, oval, or as illustrated, circular. Additionally, the body 110 can have inlets 116 with different shapes and/or sizes. In a current aspect of the gas collector 100, the inlets 116 are provided on the gas collector 100 so as to create a uniform flow of gasses from within the reaction chamber into the gas collector 100.

In one aspect of the invention (not shown), a uniform flow of gasses is created by increasing the area of the regularly spaced inlets 116 in a direction away from the outlet 124. Thus, the size of an inlet 116 farthest away from an outlet 124 is larger than the size of an inlet 116 immediately adjacent an outlet 124. Alternatively, a uniform flow of gasses is created by increasing the number of same-area inlets 116 in a direction away from the outlet 124. As such, although each inlet 116 has the same area, the density of inlets 116 in the body 110 increases in a direction away from the outlet 124. In a further aspect, a uniform flow of gasses is created by positioning a baffle in the conduit 118 adjacent each outlet 124 such that the baffle impedes the direct path of reaction gasses to the outlet 124.

Although not limited in this manner, in a current aspect of the gas collector 100, the inlets 116 are positioned on a member 112 that is stationary relative to the reaction chamber of the reactor. As illustrated, a first member 112 includes inlets 116, and the first member 112 rests on a surface within the reaction chamber (best shown in FIG. 9) and is therefore stationary relative to the reaction chamber. In so doing, the positional relationship of the inlets 116 in the first member 112 to the reaction chamber does not change. As such, by positioning inlets 116 on a member 112 that is stationary relative to the reaction chamber, the flow pattern of gasses through the reaction chamber does not vary one batch process to the next and/or from one gas collector to the next. In contrast, positioning inlets on a member that is movable relative to the reaction chamber, such as in the gas collector of the prior art, can result in the flow characteristics of gasses through the reaction chamber to vary between gas collectors and vary between processing batches.

The body 110 includes at least one outlet 124 through which reaction gasses in the conduit 118 can be exhausted to the exhaust pipe of the reactor. The outlets 124 can be formed in any of the members 110, 112, and the outlets 124 are not limited as to a particular shape or size nor are the outlets 124 limited as to a particular distribution pattern in the members 110, 1112. In a current aspect, multiple outlets 124 are provided in the body 110 such that the outlets 124 provide an even pressure differential along the circumference of the conduit 118. In this manner, the reaction gasses flow uniformly from the reaction chamber, through the inlets 116 into the conduit 118, and from the conduit through the outlets 124 and into the exhaust pipe.

Although not limited in this manner, at least one of the members 112, 114 of the body 110 can be rigid. A member 112, 114 that is rigid advantageously reduces flexing of the body 110, which can cause variations in the gas flow pattern in the reaction chamber and can also cause the leakage of gas from within the reaction chamber. Also, having a rigid member 112, 114 allows for closer control of dimensional tolerances, which allows for a tighter fit between the gas collector 100 and the reactor. The tighter fit between the gas collector 100 and the reactor also reduces the leakage of gas from within the reaction chamber. Also, because stress on deposited material built up on the surfaces of the gas collector can cause the formation of flakes, a rigid member 112, 114 can advantageously prevent the formation of flakes by reducing the stress caused by flexing of the gas collector 100. In a current aspect of the gas collector 100, the body 100 and, therefore, both the first member 112 and the second member 114 are rigid.

The members 112, 114 of the body 110 can be formed from any material capable of withstanding, without degradation, the process conditions resulting from use of the reactor. For example, when depositing GaAs, the temperature within the reaction chamber of the reactor reaches about 700° C., and the temperature at the gas collector reaches around 600–650° C. The temperature for other processes reach as high as about 1200° C. within the reaction chamber, although even higher temperatures are possible. An illustrative example of a material capable of withstanding the process conditions is Inconel, produced by Inco Alloys International.

Although not limited in this manner, the members 112, 114 of the body 110 can also be formed from a material that does not produce contaminants, such as outgassing, at the aforementioned temperatures. Contaminants can disadvantageously introduce additional reactants or particles into the reaction chamber that may interfere with the deposition process. An example of a material that does not produce contaminants is a high purity material, such as titanium and molybdenum.

Again, although not limited in this manner, the members 112, 114 of the body 110 can be formed from a material onto which the deposition material better adheres. In so doing, the extent of deposition material flaking off the gas collector 100 can be reduced because of the better adherence of the deposition material. As is known by those skilled in the art, examples of material properties that affect adherence include surface texture and porosity. An illustrative example of a material that provides good adherence for deposition materials is graphite.

In a current aspect of the invention, at least one of the members 112, 114 of the body 110 is formed from graphite. Graphite advantageously remains stable at high temperatures and does not outgas any contaminants or particles. Furthermore, reaction materials deposited with the reactor, such as GaAs, readily adhere to graphite, and graphite is a rigid material that resists flexing. As such, the use of graphite to form the members 112, 114 is particularly advantageous in preventing flaking of the reaction material deposited on the members 112, 114. In addition, graphite has good machinability, which allows for a closer control of dimensional tolerances. Furthermore, because graphite is substantially rigid, the body 110 will also be rigid, and as previously discussed, a rigid body 110 promotes a more consistent flow of reaction gasses through the reaction chamber. Still further, graphite has a lower coefficient of thermal expansion than many metals, which reduces flexing of the members 112, 114 that result from changing temperature conditions associated with a process cycle of the reactor.

The body 110 being made from a machinable material, such as graphite, also allows the portion of the body 110 adjacent the reaction chamber to be substantially circular. In contrast, the gas collector of the prior art is formed from multiple polygons; and therefore, portion adjacent the reaction chamber is not substantially circular. By forming the portion of the gas body 110 adjacent the reaction chamber to be substantially circular, the radial flow of reaction gasses into the gas collector 100 is more consistent.

Figure 9B:
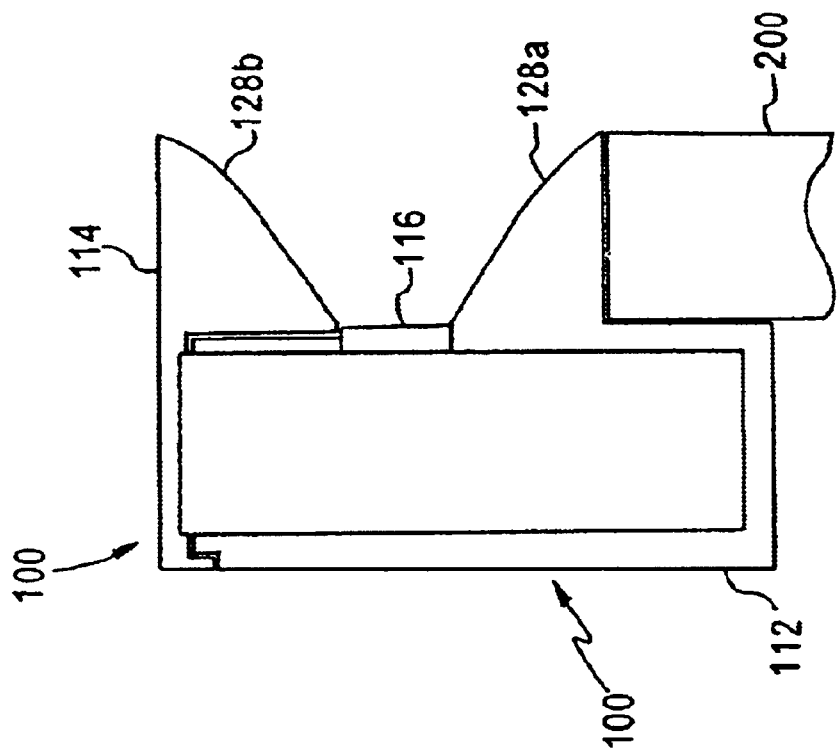
FIGS. 9A and 9B are alternative cross-section views of the gas collector.
Figure 9A:
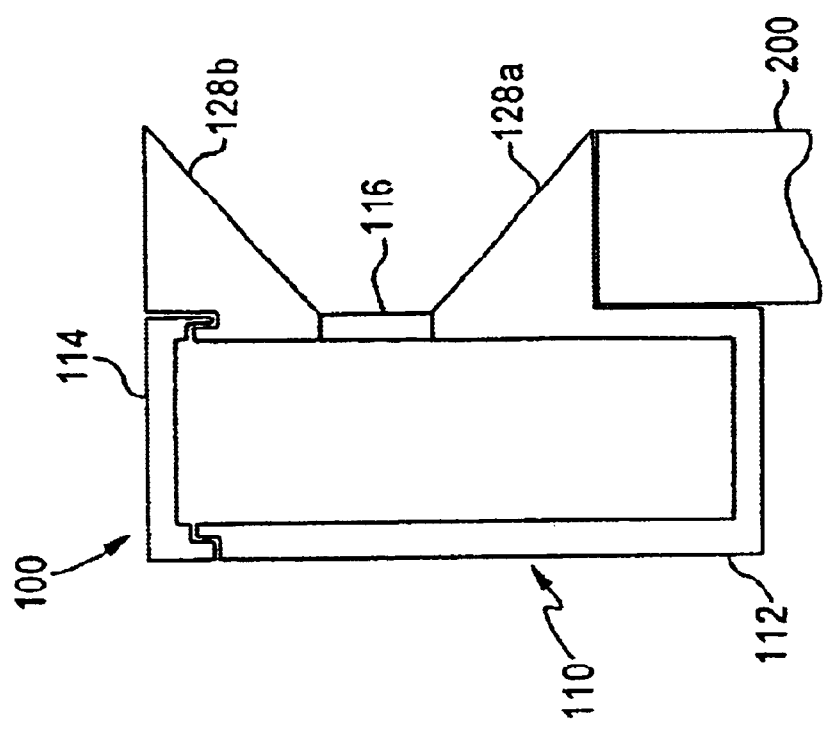

The gas collector 100 is not limited as to a particular feature that supports the gas collector 100 in the reaction chamber. For example, the bottom of the body 110 of the gas collector 100 can rest on a surface in the reaction chamber. In a current aspect, as illustrated in FIGS. 9A and 9B, the body 110 of the gas collector 100 is supported on a top surface of a platform 200 within the reaction chamber by a lip 128 extending from the body 110. Although the lip 128 can extend along the top surface of the platform 200 for any distance, in one aspect of the invention, the lip 128 covers at least 90% of the width of the top surface of the platform 200. In a current aspect, the lip 128 completely covers the width of the top surface of the platform 200. By covering a significant portion of the top surface of the platform 200 with the lip 128, flakes caused by deposition material being formed on the top surface of the platform 200 can be reduced or prevented.

In a current aspect, the first member 112 includes the inlets 116, and the first member 112 rests on a top surface of the platform 200 within the reaction chamber and is therefore stationary relative to the reaction chamber. In so doing, the inlets 116 in the first member 112 do not change their positions relative to the reaction chamber. As such, by positioning inlets 116 on a member 112 that is stationary relative to the reaction chamber, the flow pattern of gasses through the reaction chamber is consistent and does not vary one batch process to the next and/or from one gas collector to the next.

In one aspect of the invention, the portion of the body 110 adjacent to the reaction chamber is formed to reduce the formation of standing eddy currents adjacent the gas collector 100 by shaping the flow of gasses from the reaction chamber into the gas collector 100. The standing eddy currents adjacent the gas collector 100 can trap the reaction gasses, and these trapped reaction gasses can be reintroduced later into the reaction chamber to the detriment of the process.

Figure 7:
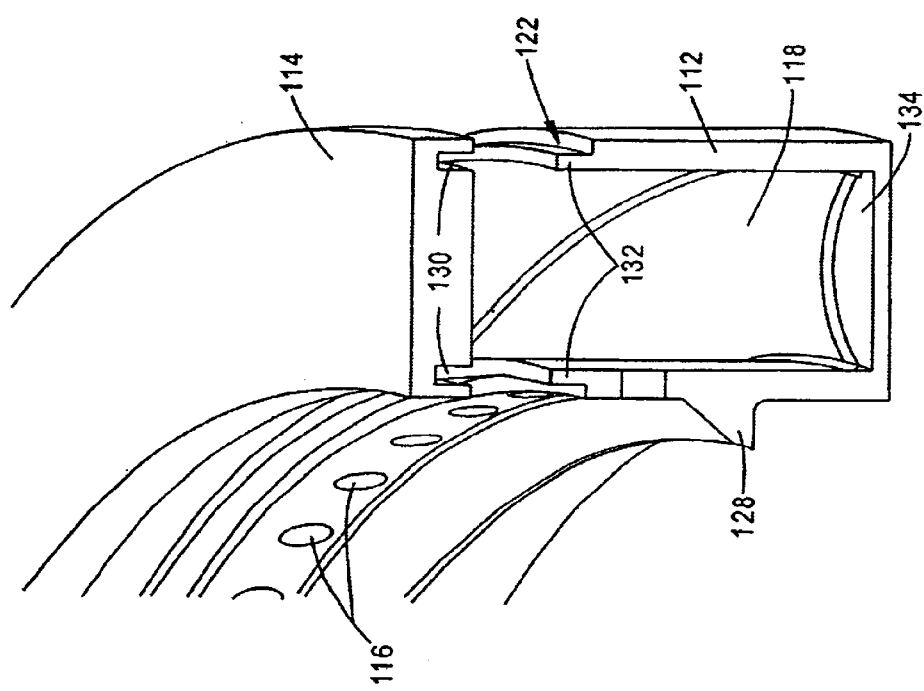
FIG. 7 is a perspective cross-sectional view of the gas collector.
Figure 8:
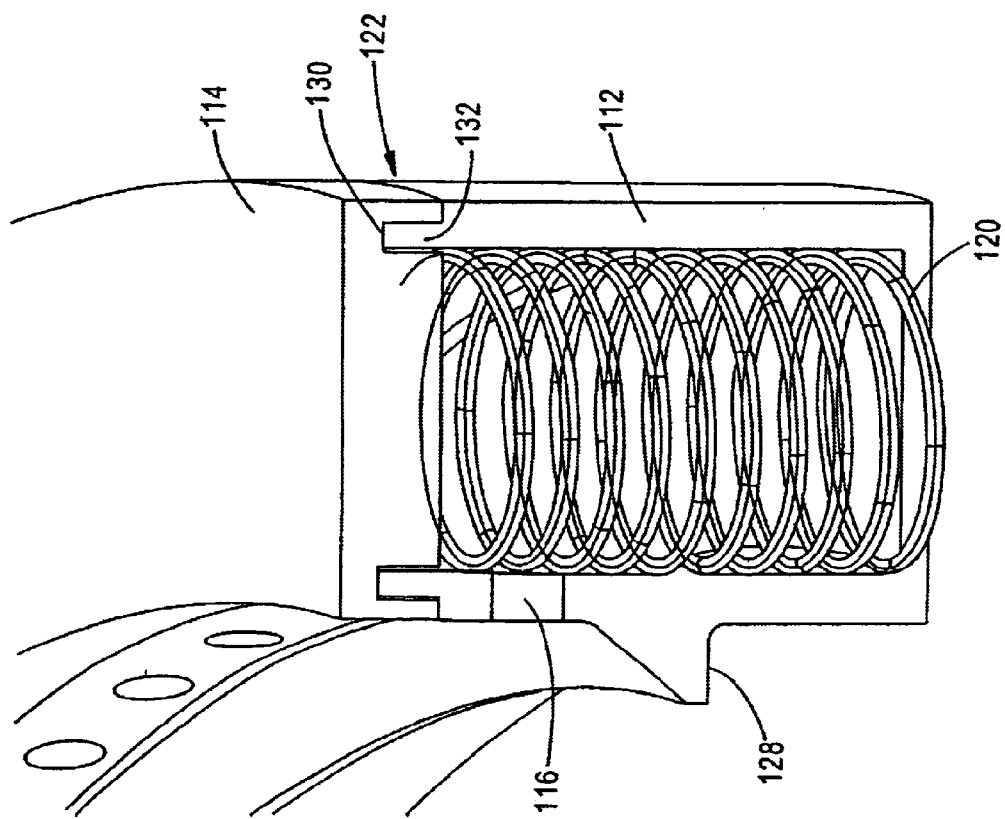
FIG. 8 is a perspective cross-sectional view of the gas collector with a spring positioned within the conduit of the gas collector.

The invention is not limited as to a particular shape of the portion of the body 110 adjacent to the reaction chamber so as to shape a flow of gasses into the gas collector 100 to prevent the creation of standing eddy currents. For example, as illustrated in FIGS. 7 and 8, the body 110 can include a lip 128 extending from the body 110 adjacent the inlets 116, or as illustrated in FIGS. 9A and 9B, the body 110 can include two lips 128a, 128b that extend from the body 110 and are adjacent to the inlets 116. In a current aspect, the lip 128 slopes horizontally inward towards the reaction chamber and vertically away from the inlet 116. In this manner, one or more lips 128 can shape the flow of gasses into the inlets 116 of the gas collector 100 so as to prevent the formation of standing eddy currents adjacent the gas collector 100.

The invention is not limited as to a particular profile of the lip 128, which shapes a flow of gasses into the conduit 118 of the gas collector 100 so as to prevent the formation of standing eddy currents adjacent the gas collector 100. For example, as shown in the FIG. 9A, the lip 128a, 128b includes a portion having a straight profile that extends towards the reaction chamber and away from the inlet 116. However, the lip 128 can include a curved profile or both a curved profile and a straight profile, as illustrated in FIG. 9B. If curved, the profile can either be convex, as illustrated in FIG. 9B, or concave.

Each lip 128 can be positioned on either a member 114 of the body 110 movable relative to the inlets 116 or a member 112 of the body 110 stationary relative to the inlets 116. For example, as shown in FIG. 9A, the lip 128 is positioned on a member 112 that is stationary relative to the inlets 116. In this manner, the positional relationship between the lip 128 and the inlets 116 is constant; and therefore, the flow of gasses into inlets 116 resulting from the lip 128 will advantageously be consistent. Alternatively, as shown in FIG. 9B, the lip 128b can be positioned on a member 114 that is movable relative to the inlets 116.

In one aspect of the invention, the first and second member 112, 114, in addition to be movable relative to one another, are also separable relative to one another. For example, the second member 114 can be easily removed from the first member 112 to expose the conduit 118. The removability of the first member 112 relative to the second member 114 promotes easy access to the conduit 118. This can be particularly advantageous during the periodic cleaning of the gas collector 100 as deposition material can form within the conduit, and this deposition material within the conduit 118 can otherwise be very difficult to access.

It has been noted that a gas collector 100 according to the invention is cleaned after approximately 200–220 processing cycles although the invention is not limited in this manner. Additionally, the gas collector 100 can be indefinitely recleaned without any detrimental effect to the gas collector 100. The gas collector of the prior art, however, requires more frequent cleaning, and the gas collector is typically recleaned only three times before the gas collector is replaced with a new gas collector. As such, the gas collector 100 according to the invention provides significant benefits over the gas collector of the prior art in a significantly reduced frequency of cleanings and a significantly increased ability to be recleaned before replacement.

The gas collector 100 can additionally include one or more devices for pressing the second member 114 against the lid to form a seal between the gas collector 100 and the lid, and any device so capable is acceptable for use with the gas collector 100. Additionally, the devices can be arranged such that an evenly distributed force is exerted against the second member 114 to form a seal between the gas collector 100 and the lid. For example, a piston contacting both the first and second members 112, 114 can be positioned within the conduit 118. Upon activation, the piston can press the second member 114 against the lid to form the seal between the gas collector 100 and the lid.

In a current aspect, the device for pressing the second member 114 against the lid is resilient such that the device resists the force of the lid pressing against the second member 114. For example, the spring-like device can consist of one or more springs 120 that contact both the first member 112 and the second member 114. Although not limited in this manner, the springs 120 are positioned within the conduit 118. Additionally, the springs 120 can be open and advantageously permit the passage of gasses through the coils of the spring 120. In so doing, locating the springs 120 within the conduit 118 only minimally interferes with the passage of reaction gasses through the conduit 118. This allows for a greater number of springs 120 to be positioned with the conduit 118 without requiring an outlet 124 between each pair of springs 120.

When the springs 120 are positioned within the conduit 118, the first and/or second members 112, 114 can include seats 134 associated with the springs 120. The seats 134 act to prevent lateral movement of each spring 120 within the conduit 118, and any seat 134 so capable is acceptable for use with the gas collector 100. In a current aspect, the seats 134 are in the form of a recess or counter-sunk hole within the first member 112. Additionally, the diameter of the springs 120 can be slightly less than the width of the conduit 118. In this manner, lateral movement of the springs 120 in a radial direction of the gas collector 100 can be prevented by the sidewalls of the conduit 118.

The springs 120 can be formed from any material capable of withstanding, without degradation, the process conditions resulting from use of the reactor. As previously discussed, an illustrative example of a material capable of withstanding the process conditions is Inconel, produced by Inco Alloys International.

Although not limited is this manner, the springs 120 are selected so that the male portion 132 of the inter-member seal 122 extends into the female portion 130 to about 40–60% of the depth of the female portion 130 when the gas collector 100 is engaged with the lid. Additionally, the springs 120 are also selected so that male portion 132 of the inter-member seal 122 at least partially extends into the female portion 130 when the gas collector 100 is not engaged with the lid, which advantageously prevents lateral movement of the second member 114 relative to the first member 112 when the gas collector 100 is not engaged with the lid. Furthermore, because the male portion 132 only extends partly into the female portion 130 when the gas collector 100 is not engaged with the lid, the inter-member seal 122 permits movement of the first member 112 relative to the second member 114 when the lid is lowered onto the second member 114 to form a seal between the second member 114 and the lid.

By providing a rigid body formed from graphite, the gas collector of the present invention provides a more even flow of reaction gasses into the gas collector from the reaction chamber, which increases the quality of the material being deposited within the reaction chamber. Furthermore, the gas collector of the present invention reduces the formation of contaminating flakes that can cause the rejection of wafers being coated within the reaction chamber. Tests have shown that rejection rate of wafers from contamination using the gas collector of the present invention is approximately 4.5%, whereas the rejection rate of wafers using the gas collector of the prior art is approximately 13.5%. The gas collector of the present invention, therefore, advantageously provides increased productivity coupled with a greater durability and a reduced need for cleaning, as compared to the gas collector of the prior art.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only an exemplary aspect of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A gas collector for collecting gasses from within a reaction chamber of a reactor, the reactor including a removable lid for enclosing the reaction chamber, comprising:
    a rigid body defining a conduit within said body, inlets, and at least one outlet; and
    a seal disposed on said body for cooperating with the lid to prevent escape of the gasses from the reaction chamber,
    wherein said inlets direct the gasses from the reaction chamber into said conduit and said at least one outlet exhausts the gasses from said conduit.

2. The gas collector according to claim 1, wherein said body includes a first member and a second member, said seal disposed on said second member.

3. The gas collector according to claim 2, further comprising inter-member seals for reducing the flow of the gasses across an interface between said first member and said second member, said inter-member seals disposed between said first member and said second member and allowing movement of the first member relative to said second member.

4. The gas collector according to claim 2, wherein said inlets are formed in said first member and said first member is stationary relative to the reaction chamber.

5. The gas collector according to claim 2, further comprising a resilient device for pressing said second member against the lid, said resilient device disposed within said conduit.

6. The gas collector according to claim 1, further comprising a lip for shaping the flow of the gasses into said inlets and supporting said body on a platform of the reactor, said lip disposed on a portion of said body adjacent the reaction chamber, whereby shaping the flow of the gasses into said inlets prevents formation of standing eddy currents adjacent said gas collector.

7. The gas collector according to claim 6, wherein said lip completely covers a top surface of the platform.

8. The gas collector according to claim 1, wherein said body includes graphite.

9. A gas collector for collecting gasses from within a reaction chamber of a reactor, the reactor including a removable lid for enclosing the reaction chamber, comprising:
    a body defining a conduit within said body, inlets, and at least one outlet, said body including at least two members separate from one another; and
    a seal disposed on said body for cooperating with the lid to prevent escape of the gasses from the reaction chamber,
    wherein said inlets direct the gasses from the reaction chamber into said conduit and said at least one outlet exhausts the gasses from said conduit.

10. The gas collector according to claim 9, wherein said body includes a first member and a second member.

11. The gas collector according to claim 10, further comprising inter-member seals for reducing the flow of the gasses across an interface between said first member and said second member, said inter-member seals disposed between said first member and said second member and allowing movement of said first member relative to said second member.

12. The gas collector according to claim 11, wherein one of said first member and said second member defines a groove and an other of said first member and said second member includes a projection, said projection engaging said groove to form said inter-member seal.

13. The gas collector according to claim 11, wherein said body includes an inner wall adjacent the reaction chamber and an outer wall opposite said inner wall, and wherein at least one of said inter-member seals is included in said outer wall.

14. The gas collector according to claim 11, wherein each of said inter-member seals allow movement of the first member relative to said second member in a common direction.

15. The gas collector according to claim 11, wherein said inter-member seal includes a male portion and a female portion interengaging with one another.

16. The gas collector according to claim 15, wherein one of said first member and said second member includes said male portion and an other of said first member and said second member includes said female portion.

17. The gas collector according to claim 15, wherein said male portion is at least partially inserted into said female portion when said gas collector and the lid are separated.

18. The gas collector according to claim 17, wherein said male portion extends about 40% to about 60% of the depth of the female portion when said gas collector is engaged with the lid.

19. The gas collector according to claim 10, wherein said inlets are formed in said first member and said first member is stationary relative to the reaction chamber.

20. The gas collector according to claim 10, further comprising a resilient device for pressing said second member against the lid, said resilient device disposed within said conduit.

21. A gas collector for collecting gasses from within a reaction chamber of a reactor, the reactor including a removable lid for enclosing the reaction chamber, comprising:
    a body defining a conduit within said body, inlets, and at least one outlet, said inlets stationary relative to the reaction chamber; and
    a seal disposed on said body for cooperating with the lid to prevent escape of the gasses from the reaction chamber,
    wherein said inlets direct the gasses from the reaction chamber into said conduit and said at least one outlet exhausts the gasses from said conduit.

22. The gas collector according to claim 21, wherein said body includes a first member stationary relative to the reaction chamber and a second member movable relative to the reaction chamber, and said inlets are disposed in said first member.

23. The gas collector according to claim 22, further comprising a device for pressing said seal against the lid.

24. The gas collector according to claim 23, wherein said seal is disposed on said second member and said device contacts said first member and said second member.

25. The gas collector according to claim 23, wherein said device includes resilient members.

26. The gas collector according to claim 23, wherein said device is disposed within said conduit.

27. The gas collector according to claim 26, wherein said device permits passage of the gasses through said device.

28. The gas collector according to claim 27, wherein said device includes springs with open coils.

29. The gas collector according to claim 26, wherein said device includes springs and wherein at least one of said at least two members includes seats associated with each of said springs.

30. The gas collector according to claim 29, wherein each of said springs have a diameter slightly less than a width of said conduit.

31. The gas collector according to claim 22, further comprising inter-member seals for reducing the flow of the gasses across an interface between said first member and said second member, said inter-member seals disposed between said first member and said second member and allowing movement of the first member relative to said second member.

32. A gas collector for collecting gasses from within in a reaction chamber of a reactor, the reactor including a removable lid for enclosing the reaction chamber, comprising:
a body defining a conduit within said body, inlets, and at least one outlet;
at least one lip for shaping the flow of the gasses into said inlets, said at least one lip disposed on a portion of said body adjacent the reaction chamber, whereby shaping the flow of the gasses into said inlets prevents formation of standing eddy currents adjacent said gas collector; and
a seal disposed on said body for cooperating with the lid to prevent escape of the gasses from the reaction chamber,
wherein said inlets direct the gasses from the reaction chamber into said conduit and said at least one outlet exhausts the gasses from said conduit.

33. The gas collector according to claim 32, wherein at least one lip is positioned on a portion of said body stationary relative to the reaction chamber.

34. The gas collector according to claim 32, wherein each of said at least one lip are positioned on a portion of said body stationary relative to the reaction chamber.

35. The gas collector according to claim 32, wherein said at least one lip slopes horizontally inwards towards the reaction chamber and slopes vertically away from said inlets.

36. The gas collector according to claim 35, wherein said at least one lip has a curved profile.

37. The gas collector according to claim 35, wherein said at least one lip has a straight profile.

38. The gas collector according to claim 32, wherein said body includes a first member and a second member, said seal disposed on said second member.

39. The gas collector according to claim 38, further comprising inter-member seals for reducing the flow of the gasses across an interface between said first member and said second member, said inter-member seals disposed between said first member and said second member and allowing movement of the first member relative to said second member.

40. The gas collector according to claim 38, wherein said inlets are formed in said first member and said first member is stationary relative to the reaction chamber.

41. The gas collector according to claim 38, further comprising a resilient device for pressing said second member against the lid, said resilient device disposed within said conduit.

42. A gas collector for collecting gasses from within a reaction chamber of a reactor, the reactor including a removable lid for enclosing the reaction chamber, comprising:
a rigid body defining a conduit within said body, inlets, and at least one outlet;
a lip extending from said body for supporting said body on a platform; and
a seal disposed on said body for cooperating with the lid to prevent escape of the gasses from the reaction chamber,
wherein said inlets direct the gasses from the reaction chamber into said conduit and said at least one outlet exhausts the gasses from said conduit, and
said lip completely covers a width of a top surface of the platform.

43. The gas collector according to claim 42, wherein said lip slopes horizontally inwards towards the reaction chamber and slopes vertically away from said inlets.

44. The gas collector according to claim 42, wherein said body includes a first member and a second member, said seal disposed on said second member.

45. The gas collector according to claim 44, further comprising inter-member seals for reducing the flow of the gasses across an interface between said first member and said second member, said inter-member seals disposed between said first member and said second member and allowing movement of the first member relative to said second member.

46. The gas collector according to claim 44, wherein said inlets are formed in said first member and said first member is stationary relative to the reaction chamber.

47. The gas collector according to claim 44, further comprising a resilient device for pressing said second member against the lid, said resilient device disposed within said conduit.

48. A gas collector for collecting gasses formed in a reaction chamber of a reactor, the reactor including a lid for enclosing the reaction chamber, comprising:
a body defining a conduit within said body, inlets, and at least one outlet, said body including graphite; and
a seal disposed on said body for cooperating with the lid to prevent escape of the gasses from the reaction chamber,
wherein said inlets direct the gasses from the reaction chamber into said conduit and said at least one outlet exhausts the gasses from said conduit.

49. The gas collector according to claim 48, wherein said body includes a first member and a second member, said seal disposed on said second member.

50. The gas collector according to claim 49, further comprising inter-member seals for reducing the flow of the gasses across an interface between said first member and said second member, said inter-member seals disposed between said first member and said second member and allowing movement of the first member relative to said second member.

51. The gas collector according to claim 49, wherein said inlets are formed in said first member and said first member is stationary relative to the reaction chamber.

52. The gas collector according to claim 49, further comprising a resilient device for pressing said second member against the lid, said resilient device disposed within said conduit.

53. The gas collector according to claim 48, further comprising a lip for shaping the flow of gasses into said inlets and supporting said body on a platform of the reactor, said lip disposed on a portion of said body adjacent the reaction chamber, whereby shaping the flow of gasses into said inlets prevents formation of standing eddy currents adjacent said gas collector.

54. The gas collector according to claim 53, wherein said lip completely covers a top surface of the platform.

55. A reactor for forming deposits from gasses introduced into the reactor, comprising:
a reactor body defining a reaction chamber into which the gasses are introduced;
a removable lid for enclosing the reaction chamber;
at least one exhaust for removing the gasses from the reactor; and
a gas collector for collecting gasses from within said reaction chamber, said gas collector including:
a rigid body defining inlets, at least one outlet, and a conduit within said body of said gas collector, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust.

56. The reactor according to claim 55, wherein said body of said gas collector includes a first member and a second member, said seal disposed on said second member.

57. The reactor according to claim 56, further comprising inter-member seals for reducing the flow of the gasses across an interface between said first member and said second member, said inter-member seals disposed between said first member and said second member and allowing movement of the first member relative to said second member.

58. The reactor according to claim 56, wherein said inlets are formed in said first member and said first member is stationary relative to said reaction chamber.

59. The reactor according to claim 56, further comprising a resilient device for pressing said second member against said lid, said resilient device disposed within said conduit.

60. The reactor according to claim 55, further comprising a platform for supporting the gas collector, and wherein said gas collector includes a lip for shaping the flow of gasses into said inlets and supporting said body on said platform, said lip disposed on a portion of said body adjacent the reaction chamber, whereby shaping the flow of gasses into said inlets prevents formation of standing eddy currents adjacent said gas collector.

61. The reactor according to claim 60, wherein said lip completely covers a top surface of said platform.

62. The reactor according to claim 55, wherein said body of said gas collector includes graphite.

63. The reactor according to claim 55, wherein said reactor is an epitaxial reactor.

64. A reactor for forming deposits from gasses introduced into the reactor, comprising:
a reactor body defining a reaction chamber into which the gasses are introduced;
a removable lid for enclosing the reaction chamber;
at least one exhaust for removing the gasses from the reactor; and
a gas collector for collecting gasses from within said reaction chamber, said gas collector including:
a body defining inlets, at least one outlet, and a conduit within said body of said gas collector, said body of said gas collector including at least two member separate from one another, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust.

65. The reactor according to claim 64, wherein said body of said gas collector includes a first member and a second member.

66. The reactor according to claim 65, further comprising inter-member seals for reducing the flow of the gasses across an interface between said first member and said second member, said inter-member seals disposed between said first member and said second member and allowing movement of the first member relative to said second member.

67. The reactor according to claim 66, wherein one of said first member and said second member defines a groove and an other of said first member and said second member includes a projection, said projection engaging said groove to form said inter-member seal.

68. The reactor according to claim 66, wherein said body includes an inner wall adjacent said reaction chamber and an outer wall opposite said inner wall, and wherein at least one of said inter-member seals is included in said outer wall.

69. The reactor according to claim 66, wherein each of said inter-member seals allow movement of the first member relative to said second member in a common direction.

70. The reactor according to claim 66, wherein said inter-member seal includes a male portion and a female portion interengaging with one another.

71. The reactor according to claim 70, wherein one of said first member and said second member includes said male portion and an other of said first member and said second member includes said female portion.

72. The reactor according to claim 70, wherein said male portion is at least partially inserted into said female portion when said gas collector and said lid are separated.

73. The reactor according to claim 72, wherein said male portion extends about 40% to about 60% of the depth of the female portion when said gas collector is engaged with said lid.

74. The reactor according to claim 65, wherein said inlets are formed in said first member and said first member is stationary relative to said reaction chamber.

75. The reactor according to claim 65, further comprising a resilient device for pressing said second member against said lid, said resilient device disposed within said conduit.

76. The reactor according to claim 64, wherein said reactor is an epitaxial reactor.

77. A reactor for forming deposits from gasses introduced into the reactor, comprising:
a reactor body defining a reaction chamber into which the gasses are introduced;
a removable lid for enclosing the reaction chamber;
at least one exhaust for removing the gasses from the reactor; and
a gas collector for collecting gasses from within said reaction chamber, said gas collector including:
a body defining inlets, at least one outlet, and a conduit within said body of said gas collector, said inlets stationary relative to said reaction chamber, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust.

78. The reactor according to claim 77, wherein said body of said gas collector includes a first member stationary relative to said reaction chamber and a second member movable relative to said reaction chamber, and said inlets are disposed in said first member.

79. The reactor according to claim 78, further comprising a device for pressing said seal against said lid.

80. The reactor according to claim 79, wherein said seal is disposed on said second member and said device contacts said first member and said second member.

81. The reactor according to claim 79, wherein said device includes resilient members.

82. The reactor according to claim 79, wherein said device is disposed within said conduit.

83. The reactor according to claim 82, wherein said device permits passage of the gasses through said device.

84. The reactor according to claim 83, wherein said device includes springs with open coils.

85. The reactor according to claim 82, wherein said device includes springs and wherein at least one of said at least two members includes seats associated with each of said springs.

86. The reactor according to claim 85, wherein each of said springs have a diameter slightly less than a width of said conduit.

87. The reactor according to claim 78, further comprising inter-member seals for reducing the flow of the gasses across an interface between said first member and said second member, said inter-member seals disposed between said first member and said second member and allowing movement of the first member relative to said second member.

88. The reactor according to claim 77, wherein said reactor is an epitaxial reactor.

89. A reactor for forming deposits from gasses introduced into the reactor, comprising:
a reactor body defining a reaction chamber into which the gasses are introduced;
a removable lid for enclosing the reaction chamber;
at least one exhaust for removing the gasses from the reactor; and
a gas collector for collecting gasses from within said reaction chamber, said gas collector including:
a body defining inlets, at least one outlet, and a conduit within said body of said gas collector,
at least one lip for shaping the flow of the gasses into said inlets, said at least one lip disposed on a portion of said body of said gas collector adjacent said reaction chamber, whereby shaping the flow of gasses into said inlets prevents formation of standing eddy currents adjacent said gas collector, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust.

90. The reactor according to claim 89, wherein at least one lip is positioned on a portion of said body of said gas collector stationary relative to said reaction chamber.

91. The reactor according to claim 89, wherein each of said at least one lip are positioned on a portion of said body stationary relative to said reaction chamber.

92. The reactor according to claim 89, wherein said at least one lip slopes horizontally inwards towards said reaction chamber and slopes vertically away from said inlets.

93. The reactor according to claim 92, wherein said at least one lip has a curved profile.

94. The reactor according to claim 92, wherein said at least one lip has a straight profile.

95. The reactor according to claim 89, wherein said body includes a first member and a second member, said seal disposed on said second member.

96. The reactor according to claim 95, further comprising inter-member seals for reducing the flow of the gasses across an interface between said first member and said second member, said inter-member seals disposed between said first member and said second member and allowing movement of the first member relative to said second member.

97. The reactor according to claim 95, wherein said inlets are formed in said first member and said first member is stationary relative to said reaction chamber.

98. The reactor according to claim 95, further comprising a resilient device for pressing said second member against said lid, said resilient device disposed within said conduit.

99. The reactor according to claim 89, wherein said reactor is an epitaxial reactor.

100. A reactor for forming deposits from gasses introduced into the reactor, comprising:
a reactor body defining a reaction chamber into which the gasses are introduced;
a removable lid for enclosing the reaction chamber;
a platform within said reaction chamber;
at least one exhaust for removing the gasses from the reactor; and
a gas collector for collecting gasses from within said reaction chamber, said gas collector including:
a rigid body defining inlets, at least one outlet, and a conduit within said body of said gas collector,
a lip extending from said body of said gas collector for supporting said body of said gas collector on said platform, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust, and
said lip extends completely covers a width of a top surface of said platform.

101. The reactor according to claim 100, wherein said lip slopes horizontally inwards towards said reaction chamber and slopes vertically away from said inlets.

102. The reactor according to claim 100, wherein said body of said gas collector includes a first member and a second member, said seal disposed on said second member.

103. The reactor according to claim 102, further comprising inter-member seals for reducing the flow of the gasses across an interface between said first member and said second member, said inter-member seals disposed between said first member and said second member and allowing movement of the first member relative to said second member.

104. The reactor according to claim 102, wherein said inlets are formed in said first member and said first member is stationary relative to said reaction chamber.

105. The reactor according to claim 102, further comprising a resilient device for pressing said second member against said lid, said resilient device disposed within said conduit.

106. The reactor according to claim 100, wherein said reactor is an epitaxial reactor.

107. A reactor for forming deposits from gasses introduced into the reactor, comprising:
a reactor body defining a reaction chamber into which the gasses are introduced;
a removable lid for enclosing the reaction chamber;
at least one exhaust for removing the gasses from the reactor; and a gas collector for collecting gasses from within said reaction chamber, said gas collector including:
a body defining a conduit within said body of said gas collector, inlets, and at least one outlet, said body of said gas collector including graphite, and
a seal disposed on said body of said gas collector for cooperating with said lid to prevent escape of the gasses from said reaction chamber,
wherein said inlets direct the gasses from said reaction chamber into said conduit and said at least one outlet exhausts the gasses from said conduit into said at least one exhaust.

108. The reactor according to claim 107, wherein said body of said gas collector includes a first member and a second member, said seal disposed on said second member.

109. The reactor according to claim 108, further comprising inter-member seals for reducing the flow of the gasses across an interface between said first member and said second member, said inter-member seals disposed between said first member and said second member and allowing movement of the first member relative to said second member.

110. The reactor according to claim 108, wherein said inlets are formed in said first member and said first member is stationary relative to said reaction chamber.

111. The reactor according to claim 108, further comprising a resilient device for pressing said second member against said lid, said resilient device disposed within said conduit.

112. The reactor according to claim 107, further comprising a lip for evenly shaping the flow of gasses into said inlets and supporting said body of said gas collector on a platform of the reactor, said lip disposed on a portion of said body of said gas collector adjacent said reaction chamber.

113. The reactor according to claim 112, wherein said lip completely covers a top surface of said platform.

114. The reactor according to claim 107, wherein said reactor is an epitaxial reactor.

* * * * *